United States Patent [19]

Ackerman

[11] Patent Number: 4,780,334
[45] Date of Patent: Oct. 25, 1988

[54] METHOD AND COMPOSITION FOR DEPOSITING SILICON DIOXIDE LAYERS

[75] Inventor: Frederick Ackerman, Cheyenne, Wyo.

[73] Assignee: General Electric Company, Schenectady, N.Y.

[21] Appl. No.: 170,620

[22] Filed: Mar. 14, 1988

Related U.S. Application Data

[62] Division of Ser. No. 25,311, Mar. 13, 1987, abandoned.

[51] Int. Cl.⁴ ............................ B32B 7/00; B32B 3/00
[52] U.S. Cl. .................................... 427/248.1; 427/58;
427/109; 427/126.2; 427/126.3; 427/164;
427/166; 427/167; 427/255.1; 427/255.7;
427/294
[58] Field of Search ...................... 427/255.7, 294, 164,
427/166, 167, 126.2, 126.3, 109, 58, 248.1, 255.1

[56] References Cited

U.S. PATENT DOCUMENTS 2,840,489  6/1958  Kempter et al. ................. 427/248.1
4,505,985  3/1985  Schmidt et al. .................. 427/248.1
4,663,373  5/1987  Ravichandran ..................... 524/101

FOREIGN PATENT DOCUMENTS 39967 10/1974 Japan .................................. 556/422

Primary Examiner—Theodore Morris
Attorney, Agent, or Firm—James Magee, Jr.; James C. Davis, Jr.

[57] ABSTRACT

A method and composition for depositing $SiO_2$ on substrates by chemical vapor deposition are provided wherein aminoxysilane reagents are utilized. These aminoxysilane reagents pyrolyze at about the same temperatures as organometallic reagents, permitting multiple alternating layers of silicon dioxide and metal oxides to be formed at the same operating temperature.

17 Claims, 1 Drawing Sheet

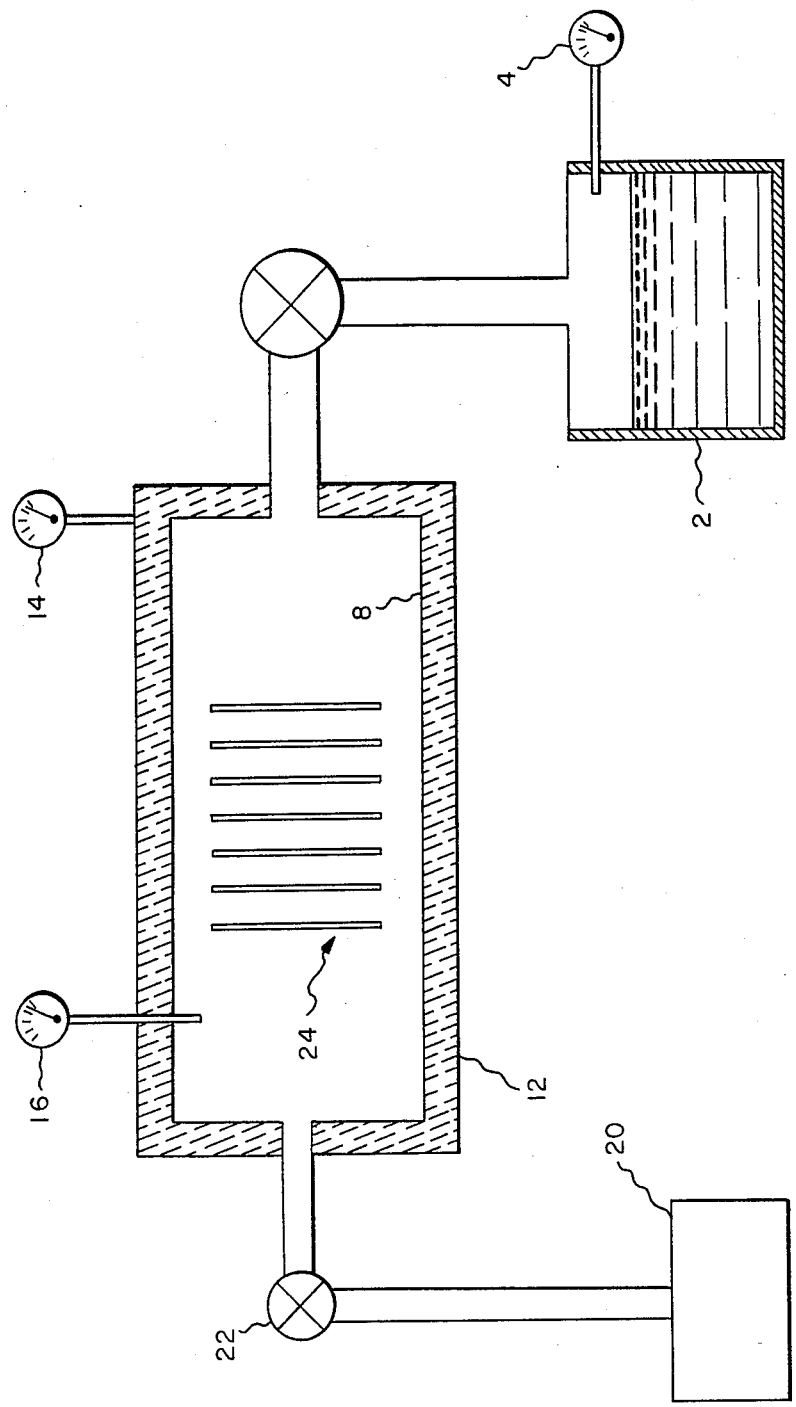

METHOD AND COMPOSITION FOR DEPOSITING SILICON DIOXIDE LAYERS

This application is a divisional of application Ser. No. 025,311, filed Mar. 13, 1987, now abandoned.

BACKGROUND OF THE INVENTION

The present invention relates to a method and composition for depositing silicon dioxide layers on substrates by chemical vapor deposition and is particularly directed to a method and composition for low temperature chemical vapor deposition of alternating layers of silica and titania.

It is known in the art that silicon dioxide layers can be formed by pyrolytic deposition of organosilicon reagents such as Silicon tetraethoxide, by chemical vapor deposition techniques. Although these alkoxy silanes provide acceptable silica layers, pyrolysis temperatures which approximate 600° C. and above are required. Such high temperature requirements pose a problem where deposition of a secondary oxide layer at pyrolysis temperatures below 600° C. is desired. There is a need in the art for a system which does not require thermal cycling of the deposition apparatus to provide alternating layers of silica and other oxides.

Alternating layers of silica and metal oxide are useful in many applications including the fabrication of optical filters capable of transmitting high-frequency radiation while reflecting low-frequency radiation. These filters comprise stacks of films with alternate indices of optical refraction and are described more particularly by Rancourt in U.S. Pat. No. 4,229,066. Silicon dioxide layers are used as the layer having a low index of refraction while some other metal oxides provide layers having a high index of refraction. So called high-pass optical filters can be used to increase the lumens per watt of an incandescent light bulb by freely transmitting visible light through the glass envelope while reflecting infrared radiation back onto the incandescent filament, thereby producing a higher filament temperature for a given input level of current.

While composition and method are especially useful in providing silicon dioxide layers for high-pass optical filters, the present invention contemplates the formation of silica layers, for other purposes, for example films used to make conformal silica layers for electronic chip passivation or dielectric insulation at transistor gates or the formation of silica layers on any suitable surface for electronic or optical utilization.

SUMMARY OF THE INVENTION

It is a principle object of the invention to provide a method for low temperature chemical vapor deposition of silica.

Another object of the invention is to provide compounds and compositions which can be pyrolytically decomposed with resulting deposition of a silica layer on a suitable substrate.

These and other objects of the invention are achieved by a process in which a pyrolyzable aminoxy (—ON) containing silane is used as a source of vapor deposited silicon dioxide.

DESCRIPTION OF THE INVENTION

The compositions of this invention comprise a pyrolyzable aminoxy silane having one or more aminoxy groups attached to a silicon atom.

The compounds of this invention can be represented by the formula:

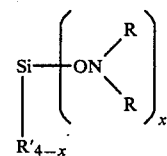

wherein R' is a monovalent hydrocarbon radical, each R, taken independently, is a monovalent hydrocarbon radical or if taken together a divalent cyclic hydrocarbon radical, and X is a whole number from 1 to 4.

It is generally preferred that R and R' be aliphatic radicals having from 1 to about 30 carbon atoms, particularly preferred radicals are the straight and branched alkyl radicals having up to about 8 carbon atoms such as methyl, ethyl, propyl, isopropyl, hexyl, octyl, and the like.

Preferred radicals represented by R in the oxyamino substituent are the linear aliphatic cycloaliphatic and aromatic groups. I should be noted that the two R groups on the nitrogen can be taken together as a single divalent cyclic group. Illustrative aromatic and cyclic groups include phenyl, cycloalkyl such as cyclobutyl, cyclohexyl and the like, and alkyl such as methyl, ethyl, propyl, isopropyl, butyl and the like. Further the two R groups on the nitrogen atom can be taken together as part of a heterocycle including the nitrogen atom, for example, an alkanediyl radical such as 1, 2-ethanediyl (—CH$_2$CH$_2$—) 1,3-propanediyl (—CH$_2$CH$_2$CH$_2$—) and the like.

The compounds of this invention can generally be vaporized at temperatures below about 300° C. and pyrolyze or decompose to deposit silica at temperatures of about 500° C. or below.

Another aspect of the invention contemplates compositions comprising vapors of the above described compounds in combination with inert gases such as nitrogen or other pyrolyzable compounds having decomposition temperatures above the decomposition temperature of the compounds of this invention.

In general the gaseous compositions of the invention can contain from about 0.1 to about 100 weight percent of a compound of this invention having a pyrolysis temperature below about 500° C. and from 0 to about 99.9 weight percent of inert species i.e., which do not pyrolyze at the pyrolysis temperature of the reactive species.

It is generally preferred that the gaseous compositions comprise at least about 97 and more preferably at least 99 weight percent of reactive components or species falling whether like scope of formula I. The high concentrations of reactive species in the composition reflect the high degree of purity necessary to provide a suitably pure film of silica. In most instances it is desirable to employ compositions containing as close to 100% by weight of the compounds of formula I.

The compositions contemplated by this invention contain silane reagents of formula I as the principal reactive species. The reactive species of formula I may be diluted with inert components by as much as 99.9% by weight. The term "inert" as used herein refers to materials which may be present as a diluent or carrier or as an imparity or which do not pyrolyze below the temperature of the substrate. These inert species may have a vaporization temperature above or below 300° C. Therefore, they may or may not vaporize with the organosilicon reagent when forming silicon dioxide layers. Where these inert species do vaporize during the chemical vapor deposition process, they function as a "carrier gas" and dilute the organosilicon reagents in the vapor phase. In that the quantity of organosilicon reagent in the vapor phase may be as small as 0.1% by weight and still provide SiO$_2$ layers, the compositions of this invention may be similarly diluted. It is preferable that the compositions of this invention contain 100% pyrolyzable species to enhance the efficiency of the chemical vapor deposition process. An example of an inert species which may be present in the compositions of this invention are organosilicons of the formula Si-(OR)$_{4-y}$(R)$_y$ where y is a number of from 0 to 4 and R is a monovalent hydrocarbon radical. Included within the species defined by this formula are those organosilicon reagents known to form silicon dioxide layers at temperatures of about 600° C. and above.

The compounds of this invention can be prepared by reacting organohydroxylamines with silicon chloride to generate the compounds of formula 1 and hydrogen chloride. Such processes are well known to those skilled in the art and are described in U.S. Pat. No. 3,448,136, to Pande et al. which is incorporated herein by reference. Although the products of the Pande et al. process may be useful for some purposes, they are unsuitable, as formed, for use in chemical vapor deposition processes. The reaction product must undergo rigorous purification steps which may comprise, for example, multiple distillations and filtrations of the distillate upon cooling.

Impurities in the compositions of this invention limit the utility of the composition in chemical vapor deposition processes. The impurities cause defects in the silicon dioxide layers formed, making these layers unacceptable for many applications. It is particularly important to remove the alkylammonium chloride and arylammonium chloride by-products obtained when producing the organosilicons of formula 1. These salts will pyrolyze on the heated substrate surface causing non-uniformity in the Silicon dioxide layer. It is preferable to maintain the concentration of these alkyl and arylammonium chlorides to less than 0.1% by weight of the composition.

The compounds of formula 1 are characterized by the presence of at least one aminoxy group. In general, the presence of 3 or 4 such groups is desirable. It is the presence of the aminoxy group which provides pyrolysis reactivity at temperatures below about 500° C. It is believed that dissociation of the aminoxy group facilitates bonding of the remaining fragment of the silane to the substrate surface while the remaining substituents are cleaved to provide a surface deposit of silicon dioxide.

The use of the compounds and compositions herein described provides a method for chemical vapor deposition of silica at temperatures significantly below the temperatures presently required to pyrolyze silanes such tetraethoxy silane.

The phrase "chemical vapor deposition process" is intended to include those CVD processes known to the art. This includes low pressure CVD (below 1 atm.), glow discharge or plasma enhanced CVD, high pressure CVD (about 1 atm.) and effusive chemical vapor deposition (ECVD). The essential features in the CVD process include contracting the surface of a heated substrate with the vapors of the organosilicon reagent at a temperature sufficiently high to induce pyrolytic deposition of silica on the surface of the heated substrate.

BRIEF DESCRIPTION OF THE DRAWING

The drawing shows a schematic representation of a simple form of effusion chemical vapor deposition apparatus comprising an effusion cell 2 having temperature measuring and controlling means 4. The effusion cell is in flow communication with reactor 8 via valve 10 and associated conduits. Reactor 8 is provided with heating means 12 and temperature and pressure measuring means 14 and 16, respectively. Vacuum pump 20 is in variable communication with the reactor via valve 22 and associated conduits. The reactor contains one or more substrates or articles to be coated shown at 24.

The compounds of Formula I can be vaporized by any convenient means, such as by heating, atomizing or by dissolving (solubilizing) the organosilicon reagent in a carrier gas. In that the organosilicon reagents of Formula I are generally liquids at room temperature, it is most preferable to generate the vapors in accordance with an effusive chemical vapor deposition (ECVD) process. ECVD is a low pressure chemical vapor deposition process wherein the reagents utilized are liquid and are vaporized to a gaseous frm by heating them in an effusion chamber which is separate from the deposition chamber. These vapors are transported to the deposition chamber by effusion to contact the surface of the heated substrate. To stimulate effusion, the deposition chamber is evacuated to a pressure below the vapor pressure of the reagents. In particular, the deposition chamber is preferably evacuated to a pressure between about 10 and about 500 microns of mercury, with an upper pressure limit being about 2000 microns. The rate of effusion can be controlled by controlling the rate of heating of reagents and by controlling the flow into the deposition chamber.

Contacting the surface of the heated substrate with the vaporized organosilicon reagents may be accomplished by conventional means. The organosilicon reagent vapors may be transported by effusion or the vapors may be transported with a carrier gas by bubbling the carrier gas through the liquid reagent. It is also foreseen that the liquid organosilicon reagents can be atomized within a deposition chamber under suitable conditions of temperature and pressure.

The organosilicon reagents utilized in this process are those of Formula 1 described above. The temperature at which these reagents are vaporized is limited to values less than 300° C. to avoid degradation. It is preferable to vaporize these reagents at a temperature within the range of about 50° to 150° C. at pressures in the range of about 10 microns to 500 microns of mercury.

The substrate is preferably heated to a temperature less than 500° C. Temperatures below 500° C. will be sufficiently high for pyrolysis where the organosilicon reagents of Formula 1 are utilized. Preferably, the substrate is heated to a temperature below 475° C. and most preferably, within the range of about 400° to 450° C. at a pressure in the range of 1 to 1000 microns (Hg). Temperatures higher than 500° C. will provide pyrolysis of the reagents but are unnecessary.

The substrate may be heated to the desired temperature by conventional means known to the art. This includes the use of a radiant energy source either internal or external to the deposition chamber. Internal means including, for example, resistive heaters and susceptors which absorb externally generated radiation, such as RF radiation. External energy sources including, for example, visible light from incandescent lamps and infrared radiation from resistive heaters, i.e., hot wall reactors.

The process is independent of the equipment utilized. The configurations and dimensions of the deposition chamber can vary significantly. Among those presently utilized are the horizontal, vertical, cylindrical and tubular systems. In the horizontal system, the substrates are typically processed laying flat. In a vertical system, the substrates are typically placed on a susceptor disc which rotates continually for uniform coverage.

Once the organosilicon reagents contact the hot surface, they pyrolyze to form silica. The co-product, typically organohydroxylamines and unsaturated organoamines, along with any unused organosilicon reagent, may be exhausted from the deposition chamber. The unused reagent may be recycled, if desired. Alternatively, this process may be carried out in the static mode wherein reagents are not replenished and co-products are not exhausted from the system.

The method of this invention is suitable for forming silica films on any surface with a temperature sufficiently high to product pyrolysis. This provides for a wide variety of substrates. This method is particularly suited for providing silica layers on refractory substrates such as silicon, silicon dioxide glass, boron glass; metallic substrates such as metals or metal alloys or both carbon fibers and carbon composites. This invention is also particularly suited for silica deposition on semiconductors such as silicon, alpha silicon, gallium arsenide, $Hg_{1-m}M_mTe$, win which M is a divalent metal, such as cadmium, m varies from 0 to 1 and includes mixtures of Group II and Group VI elements of the periodic table and mixtures of Group III and Group V elements of the periodic table.

In addition, suitable substrates include tantalum oxide-coated glass, titanium oxide-coated glass, $Si_3N_2$-coated glass and silicon dioxide-coated glass. Such substrates may include coatings of one or more films, which need not be formed by the present process. These films may be thin, i.e., typically below about 10,000 Angstroms, when preparing multilayer films for use as high-pass filters. These substrates may have a low radius of curvature, i.e., from about 0.1 to 5 centimeters and may be in the form of cylinders or spheres or those of incandescent bulbs.

The method of this invention is capable of producing silicon dioxide layers of varying thicknesses. Film thicknesses as low as about 50 Angstroms and those as thick as 100,000 Angstroms (10 microns) may be formed. A desired thickness may be obtained by controlling the rate of deposition, which may range from about 0.8 Angstroms per second to 2 Angstroms per second under temperatures of about 420° to 500° C. and pressures of about 10 to 500 microns of mercury. Higher rates can be achieved at higher temperatures. The rate of deposition, $R_d$, of silicon dioxide is in accord with the formula $$R_d = R_o e\left(\frac{-E_{act}}{R_k T}\right) \quad (1)$$

where
$R_o$ is the deposition rate of the desired deposition film product ($SiO_2$) at a normalized temperature and given pressure, which may be determined as mentioned below;

$E_{act}$ is the activation energy of the tetrakis (diethyloxyamino) silane used, a typical value of which is 35 Kcal per mole and which may be determined as mentioned below:

$R_k$ is the molar gas constant, a known quantity (1.987 cal/mole (°K.); and

T is the temperature of substrates in degrees Kelvin;

$R_o$ and $E_{act}$ are readily determinable from mathematical solution of equation (1) for two sets of measured values of $R_d$ and T at constant pressure in the deposition chamber. A typical measured value of $R_d$ and T for the present silicon dioxide film-formation example being 1500 Angstroms in 30 minutes and 430° C., respectively. The value for $R_o$ will vary with pressure.

To control the deposition rate of $SiO_2$, it is preferable to control the temperature, T, of the substrate. The rate of deposition, $R_d$, can also be increased by increasing pressure, following an increase in $R_o$ with a higher pressure.

An embodiment of the process of this invention includes the additional step of forming a metal oxide layer on the surface of said substrate. This metal oxide layer can be formed either subsequent to or prior to deposition of the $SiO_2$ layer. This metal oxide layer is formed by pyrolyzing a vaporized organometallic reagent on the surface of said substrate. The term "organometallic reagent" herein signifies a metal-containing organic compound. The organometallic reagents contain all the constituent atoms of the desired film products produced therefrom. Each contain a predetermined number of bonds per atom. Examples of metal oxide films include tantalum pentoxide (tantala) and titanium dioxide. Examples of organometallic reagents that may be used to form such films include titanium isopropoxide, titanium ethoxide, tantalum pentaethoxide and tantalum pentapropoxide. Other films and reagents which can be used include niobium pentoxide obtained from niobium pentaethoxide.

These secondary layers may be produced at about the same pyrolysis temperature used to form the silica layer. These temperatures typically range from about 400° to 500° C. Temperatures of about 440° C. are preferred. By operating at such temperatures, multilayer films or more than two alternating layers of metal oxide and silicon dioxide may be easily obtained by simply alternating te reagents fed within the deposition chamber. Where an ECVD process is used, the rate of effusion into the deposition chamber can be controlled through the use of flow controllers.

High uniformity of silicon dioxide film thickness is achieved over short distances by the process of this invention. For example, silica film having uniformity in the range of about 0.5 to 2% from perfect uniformity have been obtained.

To achieve uniformity and film thickness over long distances, such as the length of a long reaction zone in which numerous substrates are contained for mass production purposes, the depletion of the organosilicon reagent from the entrance of the reaction zone must be taken into account. The preferred technique for accomplishing this is to adjust the substrate heater to provide a uniform substrate temperature throughout the reaction zone, adjust flow rate and other process parameters to provide films having the desired uniformity.

A further technique of assuring uniformity in silica film thickness is to compensate for depletion by maintaining the substrate temperature near the exit at a higher than the substrate temperature near the entrance.

Silicon dioxide layers formed in accordance with the process of this invention have exhibited optical indices of refraction in the desirable low range of about 1.44 to 1.46, making them suitable for use in high-pass filters when combined with films of a high refractive index value, such as tantalum oxides and titanium oxides. Such multiple layer films, when surrounding an incandescent filament, provide increased lumens per watt or efficacy gains for the lamps.

In order that those skilled in the art will better able to practice the present invention, the following examples are given by way of illustration.

EXAMPLE 1

Preparation of Tetrakis Diethylaminoxy Silane

To a 20 liter round bottom flask equipped with a mechanical stirrer and nitrogen gas purge there was added 4 liters of hexane, 1640 ml. of N,N-diethylhydroxylamine and 1200 ml. of n-propylamine. Stirring was begun and 490 ml. of silicon tetrachloride were added dropwise to the mixture. The precipitation of propylammonium chloride began at this point and the mixture began to warm. Th addition of the silicon tetrachloride was regulated so that the temperature of the liquid mixture did not exceed 50° C. After addition of the silicon tetrachloride was completed, the solution was stirred at 50° C. for 10 hours. Hexane was added to maintain the reaction mixture at constant volume. The mixture was then cooled to room temperature and then the stirring was stopped. After settling for 2 hours, the mixture was vacuum filtered and the solid filtrate discarded. The remaining liquid was roto-evaporated under 10 torr at 30° C. to remove hexane and unreacted N,N-diethylhydroxylamine. The remaining yellow liquid was impure $Si[ON(C_2H_5)_2]_4$, which was purified by vacuum distillation at 400 Hg pressure and 95° C. The resulting distillate was allowed to cool for 14 hours in a hermetic container. Crystals of propylammonium chloride appeared in the liquid and were removed by vacuum filtration. The vacuum distillation, cooling and filtration were repeated twice to produce 99.99% pure material. The product was stored in a hermetic container.

EXAMPLE 2

Preparation of Tetrakisdimethylaminoxy Silane

To a 3000 ml. round bottom flask there was added 390 g of N,N-dimethylhydroxylamine hydrochloride, 1 liter of hexane and 480 g of propyl amine. As this solution was stirred under a nitrogen gas purge, 125 ml. of $SiCl_4$ was added dropwise. The temperature of the solution rose and the addition of the $SiCl_4$ was regulated so that the temperature of the reaction mixture did not exceed 60° C. After addition of the $SiCl_4$ was completed, the mixture was allowed to cool with stirring for 4 hours. The mixture was then vacuum filtered and the solid filtrate discarded. The hexane was then distilled from the solution under a nitrogen gas purge. After removing the solvent, the product was cooled and refiltered; again discarding the filtrate. The liquid fraction was vacuum distilled at 90° C. and 300 Hg pressure to produce a water white pure $Si[ON(CH_3)_2]_4$. The product was stored in a hermetic container.

EXAMPLE 3

Silica Deposition By CVD

An effusion cell attached to a CVD reactor was loaded with 50 grams of tetrakisdiethylaminoxy silane $(Si[ON(C_2H_5)]_4)$ and silicon substrates were positioned in the reaction chamber. While the reactor was at room temperature, the reaction chamber was evacuated and reagent degassed by evacuating the organosilane through the system. When a constant background pressure of about 5-10 Hg was obtained, in the reaction chamber as determined by a wall mounted pressure gauge, gas flow into the chamber was terminated. The reaction chamber temperature was raised to about 420° C. as determined by a temperature gauge mounted on the chamber wall. The effusion cell temperature was raised to about 110° C. and effusion of $Si[ON(C_2H_5)_2]_4$ through the reaction chamber was started. These conditions were maintained for a period of one hour, during which about 3600 A of $SiO_2$ was deposited on the substrates within the reaction chamber. After deposition, the system was cooled to room temperature and the substrates removed.

EXAMPLE 4

An effusion cell attached to a substrate-containing CVD reactor was loaded with 50 grams of tetrakisdimethylaminoxy silane reagent. While at room temperature, the system including the effusion cell, was evacuated to purge the system and degas adsorbed gases from the reagent. When a constant pressure of about 5 to 10 microns of mercury at room temperature was reached, the effusion cell valve was closed. The temperature of the reactor was raised to about 420° C. and temperature of the effusion cell was increased to about 110° C. The reactor and effusion cell valves were opened establishing flow communication from the effusion cell to the reactor chamber. Pressure was maintained at about 100 microns for a period of about one hour during which time a layer of about 3600 Angstroms of silica was deposited on the substrate in the reactor chamber. After deposition was completed, the effusion cell was closed off and the reactor cooled to room temperature.

EXAMPLE 5

The temperature and pressure dependence of the deposition rate of $SiO_2$ from tetrakisdiethylaminoxy silane is shown in Table 1, below.

TABLE 1

| | Rate of $SiO_2$ Deposition | |
|---|---|---|
| | Pressure | |
| Temperature | 100μ | 300μ |
| 430 | 1.23 A°/sec | 3.87 A°/sec |
| 420 | .96 | 3.50 A°/sec |
| 410 | .715 A°/sec | 2.04 A°/sec |
| 400 | .475 A°/sec | 1.35 A°/sec |
| 390 | .302 A°/sec | .744 A°/sec |
| 380 | .166 A°/sec | .609 A°/sec |

From this data, the conditions necessary to achieve a desired rate and the fundamental rate parameter can be determined.

While only certain preferred features of this invention have been shown by way of illustration, many modifications and changes will occur to those skilled in the art. Therefore, it is to understood that the appending claims are intended to cover all such modifications and changes as fall within the true spirit and scope of this invention.

What is claimed is:

1. A chemical vapor deposition method for forming $SiO_2$ layers on a substrate which comprises contacting organosilicon reagent vapors with the surface of a heated substrate and heating said substrate to a temperature sufficiently high to pyrolyze said organosilicon vapors onto said surface, said organosilicon reagent comprising at least one compound of the formula $$Si(L)_{4-x}(ONR'_2)_x \qquad I$$

wherein x is at least 1, L is of a formula selected from the group consisting of —OR" and —ON=R''', R' and R" are monovalent hydrocarbon radicals of less than 30 carbon atoms and R''' is a divalent hydrocarbon radical of less than 30 carbon atoms and, said organosilicon reagent being vaporized at a temperature below 300° C.

2. A method as in claim 1 wherein said substrate is heated to a temperature below 475° C.

3. A method as in claim 1 wherein each R' of formula I is independently alkyl radicals of from 1 to 8 carbon atoms, each R" is independently selected from the group consisting of alkyl and alkene radicals of from 1 to 8 carbon atoms and aryl radicals from 6 to 10 carbon atoms and each R''' is independently alkene of from 1 to 8 carbon atoms.

4. A method as in claim 1 wherein x is 3 or 4, and each R' of formula I is selected from the group consisting of methyl, ethyl, propyl and isopropyl.

5. A method as in claim 1 wherein the organosilicon reagent is selected from the group consisting of Si[ON($C_2H_5$)$_2$]$_4$, Si[ON($CH_3$)$_2$]$_4$ and Si(ONCHCH$_3$)[ON($C_2H_5$)$_2$]$_3$.

6. A method as in claim 1 wherein the organosilicon reagent is vaporized at a temperature in the range of 50° to 150° C. at a pressure in the range of 1 micron to 1000 microns of mercury.

7. A method as in claim 1 wherein said substrate is selected from the group consisting of silicon, silicon dioxide glass, boron glass, tantalum oxide-coated glass, titanium oxide-coated glass, $Si_3N_4$-coated glass, metal, metal alloy, carbon fibers, carbon composites, α-Si, GaAs, $Hg_{1-m}M_mTe$, where M is a divalent metal and m is 0 to 1, mixtures of III and Group V elements of the periodic table and mixtures of Group II and Group VI elements of the periodic table.

8. A method as in claim 1 wherein pyrolysis of said organosilicon reagent takes place at a pressure in the range of 1 micron to 1000 microns of mercury and a temperature in the range of 350° C. to 450° C.

9. A method as in claim 1 wherein the $SiO_2$ layer produced has a thickness in te range of 50 Angstroms to 100,000 Angstroms.

10. A method as in claim 1 wherein pyrolysis of the organosilicon reagent takes place in the presence of an inert carrier gas.

11. A method as in claim 1 further comprising the additional step of forming a metal oxide layer on said substrate by pyrolyzing a vaporized organometallic reagent on the surface of said substrate.

12. A method as in claim 11 wherein the metal oxide layer is formed subsequent to deposition of $SiO_2$.

13. A method as in claim 11 wherein the metal oxide layer is formed prior to deposition of $SiO_2$.

14. A method as in claim 11 wherein the organometallic reagent and organosilicon reagent are pyrolyzed at about the same temperature selected from values falling in the range of about 350° C. to 500° C.

15. A method as in claim 14 wherein more than 2 alternating layers of metal oxide and $SiO_2$ are formed.

16. A method as in claim 11 wherein the metal oxide layer is $TiO_2$, formed by pyrolysis of an organometallic reagent selected from the group consisting of titanium ethoxide and titanium isopropoxide.

17. A method as in claim 11 wherein the metal oxide layer is $Ta_2O_5$ formed by pyrolysis of an organometallic reagent selected from the group consisting of tantalum pentaethoxide and tantalum pentapropoxide.

* * * * *

UNITED STATES PATENT AND TRADEMARK OFFICE
CERTIFICATE OF CORRECTION

PATENT NO. : 4,780,334
DATED : October 25, 1988
INVENTOR(S) : John F. Ackerman

It is certified that error appears in the above-identified patent and that said Letters Patent is hereby corrected as shown below:

On the title page, item [75]:
The correct name should be: John F. Ackerman

Signed and Sealed this

Twenty-first Day of March, 1989

Attest:

DONALD J. QUIGG

*Attesting Officer*  *Commissioner of Patents and Trademarks*